(12) United States Patent
Bai et al.

(10) Patent No.: US 6,204,103 B1
(45) Date of Patent: Mar. 20, 2001

(54) PROCESS TO MAKE COMPLEMENTARY SILICIDE METAL GATES FOR CMOS TECHNOLOGY

(75) Inventors: Gang Bai, San Jose; Brian S. Doyle, Cupertino, both of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/157,114

(22) Filed: Sep. 18, 1998

(51) Int. Cl.[7] .................................................. H01L 21/8238
(52) U.S. Cl. ........................ 438/224; 438/229; 438/230; 438/231; 438/286; 438/301; 438/305
(58) Field of Search ..................................... 438/231, 286, 438/301, 303, 305, 224, 229, 230

(56) References Cited

U.S. PATENT DOCUMENTS 5,849,616 * 12/1998 Ogoh ...................................... 438/231
5,949,092 * 9/1999 Kadosh et al. ........................... 257/67

* cited by examiner

Primary Examiner—David Nelms
Assistant Examiner—Reneé R. Berry
(74) Attorney, Agent, or Firm—Blakely, Sokoloff, Taylor & Zafman LLP

(57) ABSTRACT

The present invention provides a method of forming first and second transistor devices. A first region of silicide is formed over a first portion of a gate dielectric that overlies a first well region in a semiconductor substrate. A second region of silicide is formed over a second portion of the gate dielectric. The second portion of the gate dielectric overlies a second well region in the semiconductor substrate. First and second doped junction regions are formed in the first and second well regions respectively.

20 Claims, 7 Drawing Sheets

PROCESS TO MAKE COMPLEMENTARY SILICIDE METAL GATES FOR CMOS TECHNOLOGY

BACKGROUND OF THE INVENTION

I. Field of the Invention

The present invention relates to the field of semiconductor devices. More specifically, the present invention relates to the field of fabrication of semiconductor devices.

II. Background Information

Modern day Metal-Oxide-Semiconductor Field-Effect Transistors (MOSFET) utilize gates made of polysilicon gates. One disadvantage in utilizing polysilicon gates for MOSFETs is the depletion effect that affects polysilicon gates. At inversion, a polysilicon gate generally experiences depletion of carriers in the area of the polysilicon adjacent the gate dielectric. The depletion effect reduces the effective gate capacitance of the MOSFET incorporating a polysilicon gate. Ideally, it is desirable that the gate capacitance is high. The higher the gate capacitance, more charge is accumulated on both sides of the gate capacitor, and therefore more charge is accumulated in the channel. As more charge is accumulated in the channel, the drain-source current becomes higher when the transistor is biased.

FIG. 1 illustrates in simplified form a cross-sectional view through a MOSFET that has a polysilicon gate 8. Due to the polysilicon material of gate 8, the depletion effect causes charged carriers to accumulate near interface 12 between gate 8 and the gate oxide dielectric 2. Accordingly, the effective gate capacitance, theoretically expressed by the formula $C=\epsilon/T$ decreases ($\epsilon$ is the dielectric constant of gate oxide 2 and T is the distance between the plates of the capacitor). This is due to an "increase" in the effective distance between the charges accumulated on both sides of the gate oxide 2. The effective distance that separates the charge on both sides of gate oxide 2 becomes approximately X instead of T. The distance X is larger than T due to the depletion of charge, in the polysilicon gate 8, in the vicinity of interface 12. Accordingly, polysilicon gate 8 causes the effective gate capacitance to decrease.

FIG. 2 illustrates a cross-sectional view through a MOSFET 14 with a silicided polysilicon gate 16. The polysilicon gate 16 has a layer of silicide 18 formed on top thereof. The layer of silicide 18 contributes to a decrease in the resistance R of the polysilicon gate 16. The decrease in resistance R causes a decrease in the time propagation delay RC of gate 16. While silicide 18 may help decrease the resistance of the gate, charge is still depleted in the vicinity of interface 20 between gate 16 and gate oxide 117, thereby causing a smaller effective gate capacitance.

FIG. 3 illustrates a cross-sectional view through a MOSFET transistor with a gate electrode 22 made entirely of metal. The metal of gate 22 helps prevent depletion of charge through the gate 22. This prevents the effective thickness of the gate capacitor to increase and the capacitance to decrease as a result of the depletion effect. However, utilization of gate electrodes built entirely of metal poses problems in the case of PMOS and NMOS pairs of devices built according to the complementary metal oxide semiconductor (CMOS) technology.

FIG. 4 illustrates a pair of NMOS 28 and PMOS 29 devices. The PMOS and NMOS devices 28 and 29 respectively have different Fermi levels. A semiconductor, such as silicon, for example, has a certain energy level conventionally measured by its Fermi level. The intrinsic Fermi level of an undoped semiconductor is typically at the middle of the bandgap, between conduction and valence band edges. In an N-type doped silicon the Fermi level is closer to the conduction band while in a P-type doped silicon the Fermi level is closer to the valence band.

Metal gate electrodes have been used, in NMOS and PMOS devices built according to CMOS technology, in the form of mid-bandgap metal gate electrodes. These metal gate electrodes have a Fermi level selected midway between the Fermi level of NMOS and PMOS devices to maintain symmetry between NMOS and PMOS devices (midbandgap metal technique). The shortcoming of the mid-bandgap metal technique is that a mid-bandgap metal cannot deliver the small threshold voltage ($V_t$) necessary for future technologies without degrading short channel effects.

It is desirable to provide a pair of NMOS and PMOS transistors and a process for fabricating these transistors -where the gate depletion effect is reduced, if not eliminated, and both the NMOS and PMOS transistors operate at Fermi levels at which both the NMOS and the PMOS devices perform optimally.

SUMMARY OF THE INVENTION

The present invention provides a method of forming first and second transistor devices. A first region of silicide is formed over a first portion of a gate dielectric that overlies a first well region in a semiconductor substrate. A second region of silicide is formed over a second portion of the gate dielectric. The second portion of the gate dielectric overlies a second well region in the semiconductor substrate. First and second doped junction regions are formed in the first and second well regions respectively.

BRIEF DESCRIPTION OF THE DRAWINGS

The features, aspects, and advantages of the present invention will become more fully apparent from the following detailed description, appended claims, and accompanying drawings in which:

DETAILED DESCRIPTION OF THE INVENTION

In the following description, numerous specific details are set forth to provide a thorough understanding of the present invention. However, one having ordinary skill in the art should recognize that the invention may be practiced without these specific details. In some instances, well-known circuits, structures, and techniques have not been shown in detail to avoid obscuring the present invention.

The present invention provides a method of forming first and second transistors. A first region of silicide is formed over a first portion of a gate dielectric that overlies a first well region in a semiconductor substrate. A second region of silicide is formed over a second portion of the gate dielectric. The second portion of the gate dielectric overlies a second well region in the semiconductor substrate. First and second doped regions are formed in the first and second well regions respectively. The silicide of the gates prevents the depletion effect that otherwise would lead to decreased gate capacitance. Moreover in the case where the first and second transistors are fabricated according to CMOS technology and the gates of the transistors are made of complementary silicides, the shortcoming of the mid-bandgap metal technique is avoided.

Figure 1:
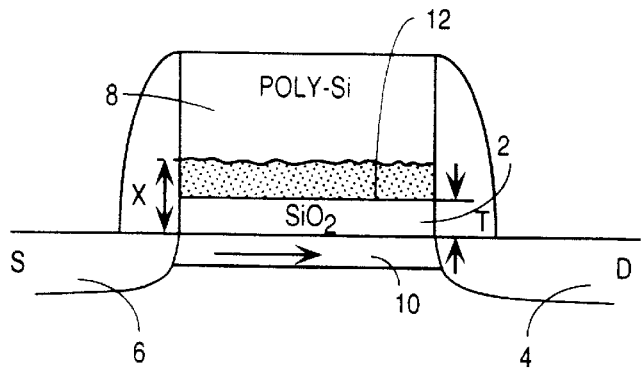
FIG. 1 illustrates in simplified form a cross-sectional view through a MOSFET with a polysilicon gate.
Figure 2:
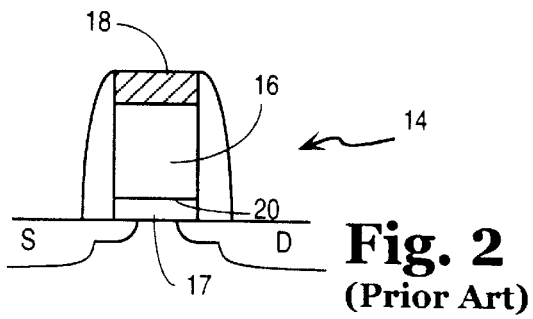
FIG. 2 illustrates a cross-sectional view through a MOSFET with a silicided polysilicon gate.
Figure 3:
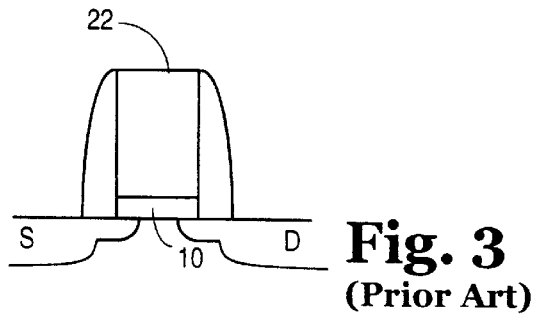
FIG. 3 illustrates a cross-sectional view through a MOSFET with a gate electrode made entirely of metal.
Figure 4:
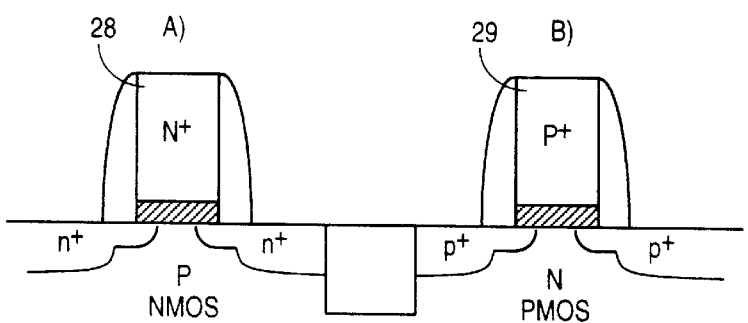
FIG. 4 illustrates a cross-sectional view through a pair of NMOS and PMOS transistors.
Figure 5:
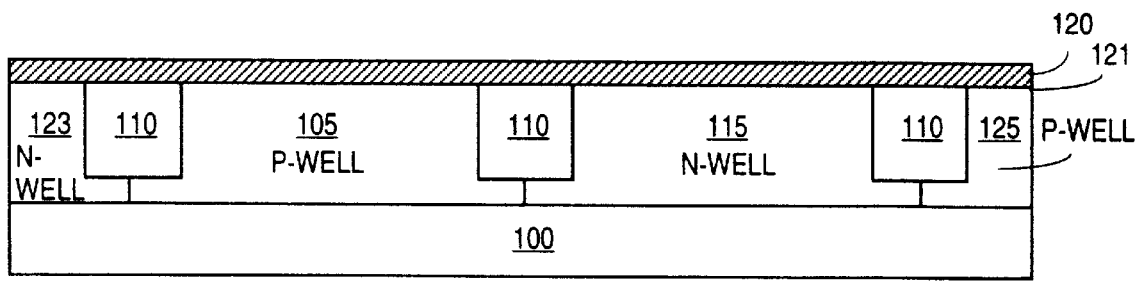
FIG. 5 illustrates a cross-sectional view through a substrate with shallow trench isolation structures and well regions formed therein.

FIG. 5 illustrates a semiconductor substrate 100 that includes shallow trench isolation structures 110 formed in substrate 100. Substrate 100 includes a silicon substrate in one embodiment of the process according to the present invention. In this embodiment, shallow trench isolation structures 110 demarcate regions or areas, for individual transistor devices, to be formed in substrate 100.

Well regions 105 and 115 are formed in the individual regions or areas demarcated by shallow trench isolation structures 110. For example, P-type well region (hereinafter referred to as "P-type well") 105 is formed in one region of substrate 100 while N-type well region (hereinafter referred to as "N-type well") 115 is formed in a second region of substrate 100. The P-type well may be formed by introducing a dopant, such as boron, for example, into the substrate 100. N-type well 115 may be formed by introducing a dopant, such as arsenic, phosphorous, or antimony, for example, into substrate 100. The practice of forming shallow trench isolation structures 110 and wells 105 and 115 are well-known in the art and therefore are not presented herein. Note that while portions of N-well 123 and of P-well 125 are also shown in the Figure, the following discussion focuses on P-well 105 and N-well 115, being understood that the process described herein equally applies to N-well region 123 and to P-well region 125.

A gate dielectric layer 120 is formed over a top surface 121, of substrate 100. The gate dielectric layer 120 may be grown or deposited over surface 121. Gate dielectric 120 may be made of silicon dioxide ($SiO_2$), for example, that may be grown by thermal techniques over surface 121 of substrate 100. It is to be appreciated that other gate dielectric layers may be used to optimize the PMOS and NMOS devices that are built by way of the embodiment of the process according to the present invention described herein. For example, gate dielectrics having a high dielectric constant, to increase the capacitance of the gate, may be utilized in an appropriate manner as known in the art.

Figure 6:
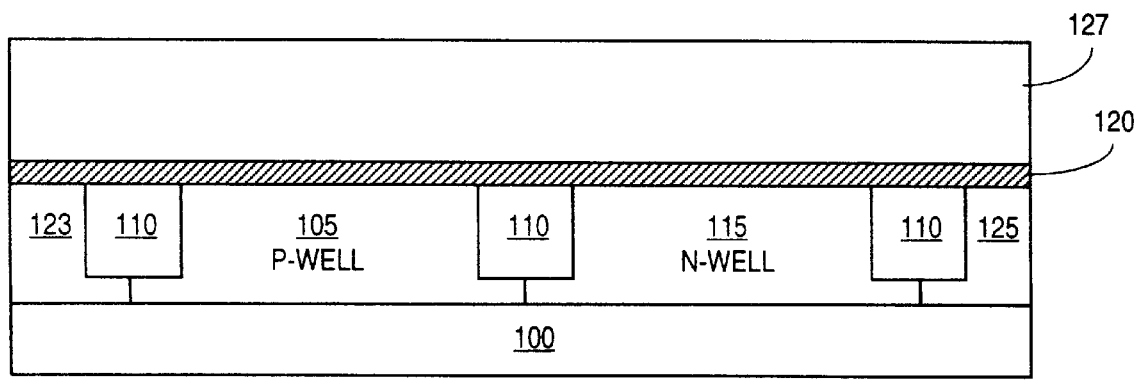
FIG. 6 illustrates a cross-sectional view through the semiconductor substrate after the further processing step of depositing a polysilicon layer.

FIG. 6 shows substrate 100 after the further processing step of depositing a polysilicon layer 127 over the gate dielectric layer 120. Polysilicon layer 127 may be deposited, for example, by a process of chemical vapor deposition (CVD) well-known in the art. Polysilicon layer 127 is deposited to a desired gate thickness suitable for the PMOS and NMOS devices desired characteristics.

Figure 7:
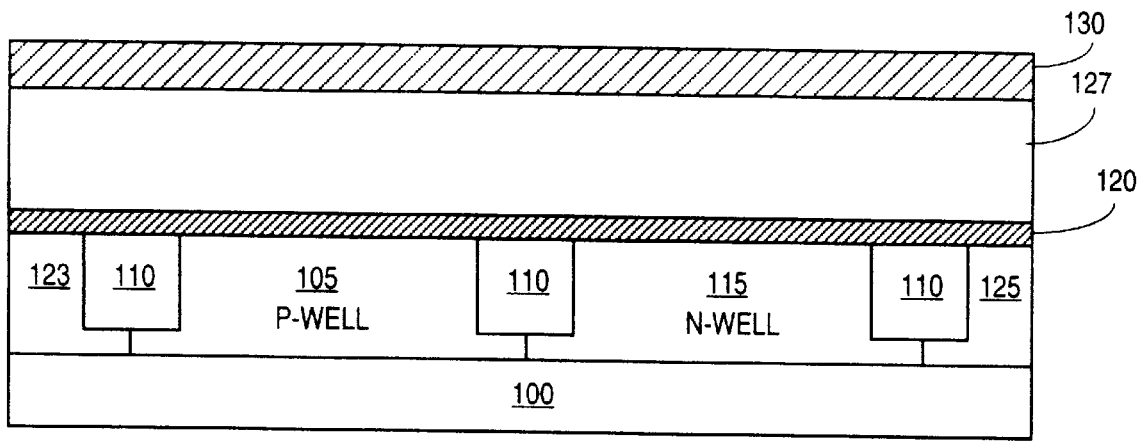
FIG. 7 illustrates the substrate of FIG. 7 with a first metal layer formed on the polysilicon layer.

FIG. 7 illustrates the substrate of FIG. 6 where a metal layer 130 is formed on polysilicon layer 127. The metal layer 130 overlies both the P-type well 105 and the N-type well 115. Note that although in the embodiment described herein metal layer 130, formed on polysilicon layer 127, overlies both the P-well 105 and the N-well 115, in other embodiments of the present invention metal layer 130 may be deposited only over a portion of polysilicon layer 127 that overlies P-well 105. In the embodiment of the present invention described herein metal layer 130 is made of titanium (Ti) that has a Fermi level close to the energy level of the conduction band.

Figure 8:
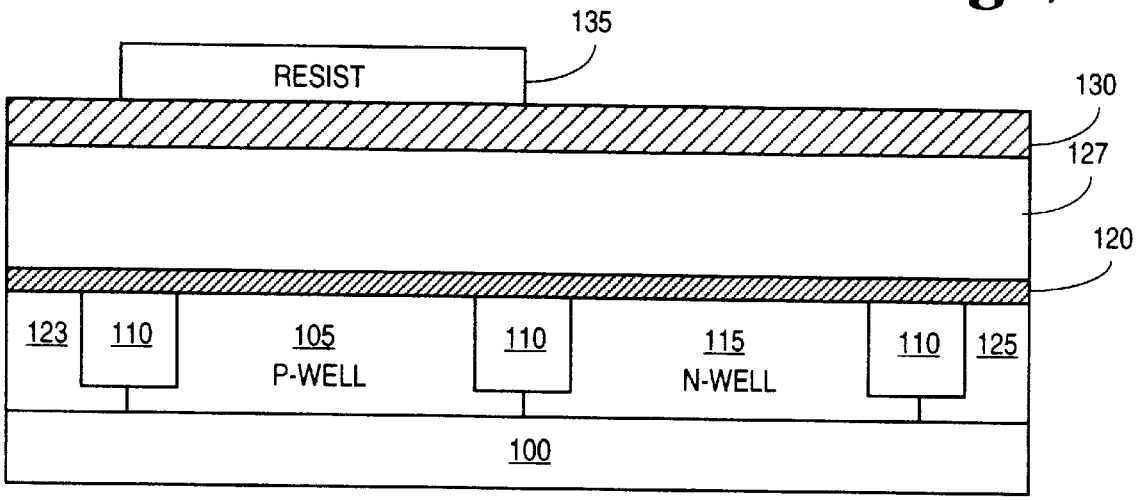
FIG. 8 shows a cross-sectional view through the substrate after the further processing step of patterning a photoresist layer over a portion of metal layer.

FIG. 8 shows a cross-sectional view through substrate 100 after the further processing step of patterning a photoresist layer 135 over a portion of metal layer 130. In FIG. 8, photoresist layer 135 is patterned over a portion of metal layer 130, that overlies P-well 105, by way of a well-known process of photolithography.

After patterning, exposure, and etching the remaining portion of photoresist 135 extends from one shallow trench isolation structure 110 to the next adjacent shallow trench isolation structure 110 overlying P-well 105.

Figure 9:
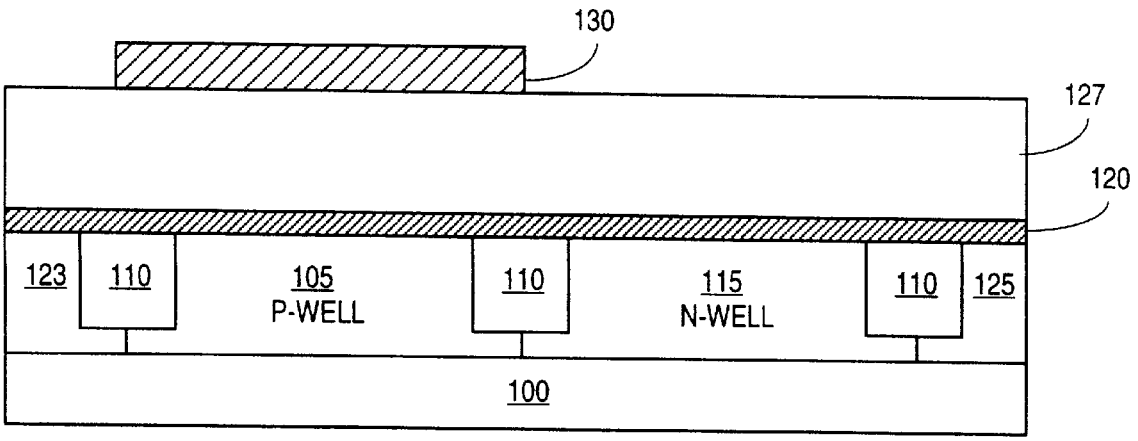
FIG. 9 shows a cross-sectional view through the semiconductor substrate after the further processing step of etching the first metal layer and removing the photoresist.

FIG. 9 shows a cross-sectional view through substrate 100 after the further processing step of etching metal layer 130, of FIG. 8, not covered by photoresist 135 and removing photoresist layer 135. Metal layer 130 is removed from all areas except from the area protected by photoresist layer 135 such that the metal area overlying P-type well 105 remains. The etch of metal layer 130 stops at polysilicon layer 127. One example of a suitable type of etch for a N-type metal such as Ti is a chlorine-based plasma etch.

Figure 10:
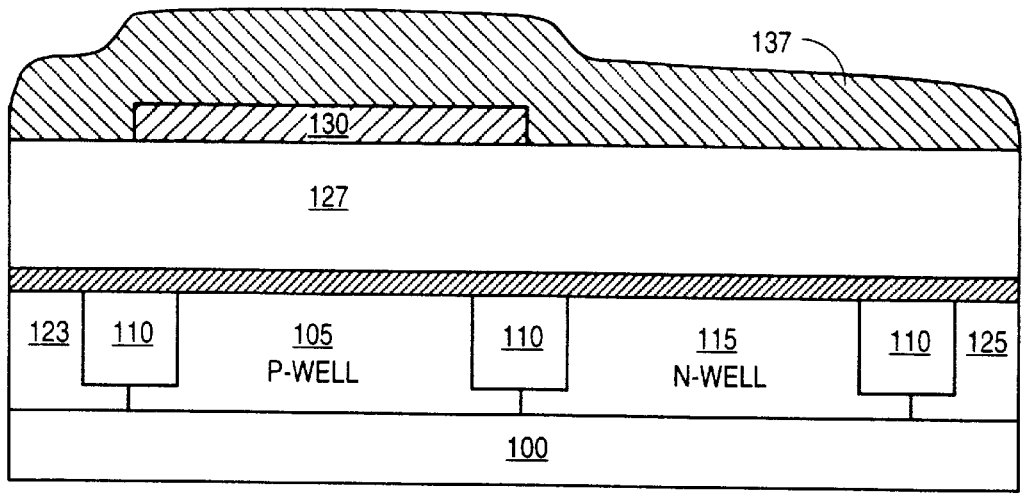
FIG. 10 shows a cross-sectional view through the semiconductor substrate after the further processing step of conformally depositing a second metal over the semiconductor substrate.

FIG. 10 shows a cross-sectional view through substrate 100 after the further processing step of conformally depositing a complementary metal (P-type metal 137) over metal layer 130 and the top surface of polysilicon layer 127. The P-type metal 137 is conformally deposited such that the thickness of P-type metal 137 is consistent and conforms to the topography of the first metal layer 130 and of the top surface of polysilicon layer 127. The thickness of P-type metal 137 is chosen according to the desired characteristics of the PMOS and NMOS devices to be formed. Al example of a metal suitable for P-type metal 137 is Molybdenum, which is used in the embodiment of the present invention described herein. Metals suitable for layer 137 have Fermi levels close to those of P-type doped polysilicon (e.g., 5.2 electron-volts).

Figure 11:
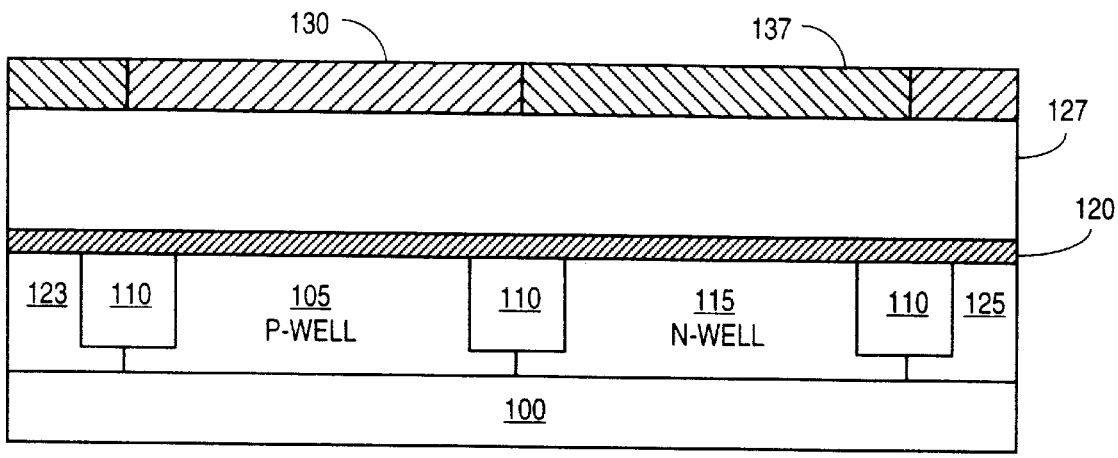
FIG. 11 shows the semiconductor substrate after the further processing step of planarizing second metal layer to the thickness of first metal layer.

FIG. 11 shows a cross-sectional view through substrate 100 after the further processing step of planarizing P-type metal 137 to the thickness of N-type metal layer 130. The planarization may be accomplished by way of a chemical-mechanical polishing (CMP) process.

It is to be appreciated that the Fermi level of most metals may be modified. Metals may exist at a desired Fermi level in their natural state or by chemical reactions such as, alloying, doping, etc. In the embodiment of the present invention described herein, layer 130 is a metal that when reacting, with the underlying portion of polysilicon 127, gives rise to a N-type silicide, i.e., its Fermi level is close to the conduction band. Similarly, layer 137 is a metal that when reacting with the underlying portion of polysilicon 127 gives rise to a P-type silicide, i.e., its Fermi level is close to the valence band.

The structure of FIG. 11 is annealed (heated) for approximately one-half hour to a temperature of approximately 750° Fahrenheit. Annealing causes metals 137 and 130 to react with the underlying polysilicon 127 to form first and second regions of silicide over the gate dielectric 120.

Figure 12:
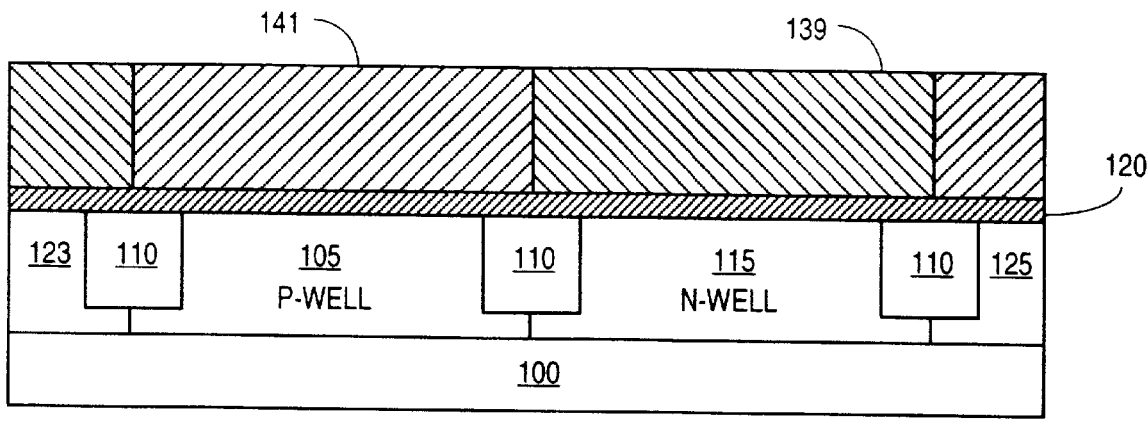
FIG. 12 illustrates a cross-sectional view through the silicon substrate after a reaction is caused between the first metal layer and the underlying polysilicon layer and between the second metal layer and the underlying polysilicon layer that results in the creation of first and second regions of silicide.

FIG. 12 illustrates a cross-sectional view through the silicon substrate after the silicon substrate is subjected to temperature annealing that causes a reaction between each of the two complementary metal layers 130 and 137 and the underlying polysilicon layer 127 that results in the creation of first and second regions of silicide 141 and 139, respectively. The two metals 130 and 137 are chosen so that their silicides (TiSi2 and MoSi2) have work functions suitable for optimized NMOS and PMOS performance (approximately 4.1 eV and 5.1 eV, respectively). The thickness of metals 130 and 137 is such that the reaction between these metals and the underlying portions of polysilicon 127 consumes entirely the underlying polysilicon layer 127 thereby forming first and second regions of silicide 141 and 139.

Figure 13:
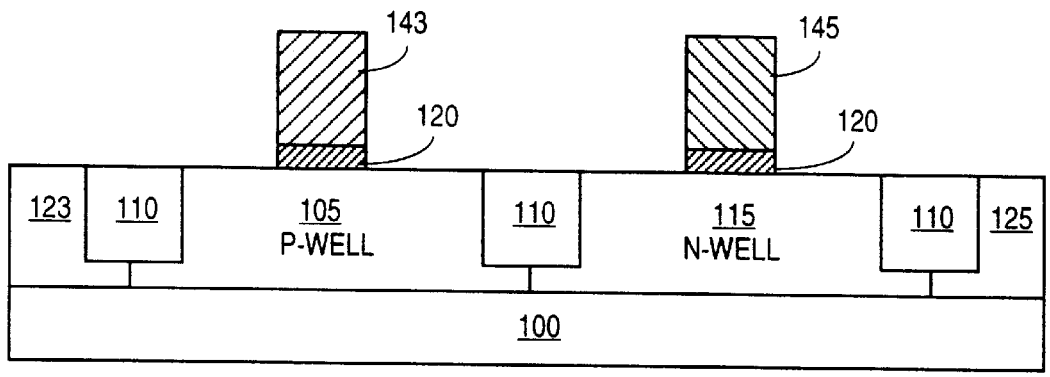
FIG. 13 shows a cross-sectional view through the silicon substrate after the further processing step of etching the individual first and second silicided regions.

FIG. 13 shows a cross-sectional view through substrate 100 after the further processing step of etching the individual first and second regions of silicide 141 and 139 respectively. The first region of silicide (TiSi2) 141 is patterned into first silicided gate electrode 143 over the area of substrate 100 occupied by P-type well 105. The second region of silicide (MoSi2) 139 is patterned into second silicided gate electrode 145, over the area of the substrate 100 occupied by N-type well 115. The lateral widths of the individual N-type gate electrode 143 and P-type gate electrode 145 are selected in accordance with the desired characteristics of the NMOS and PMOS devices to be provided.

Figure 14:
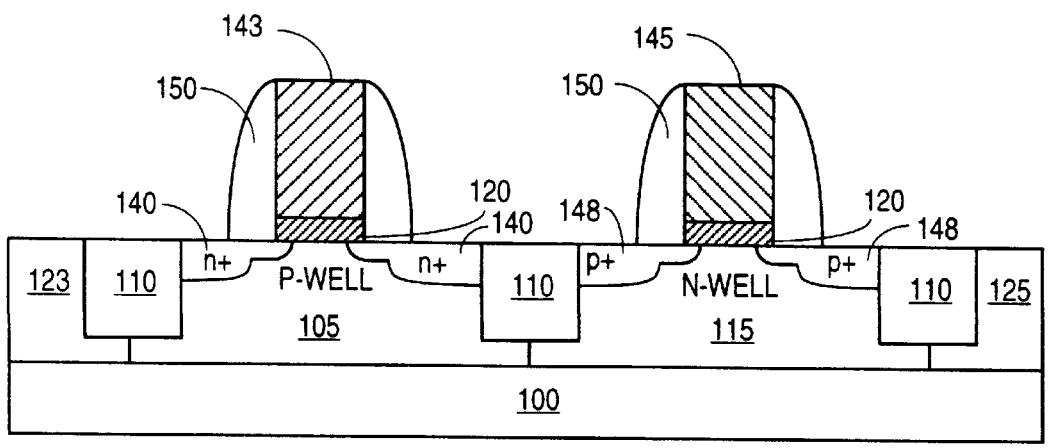
FIG. 14 shows a cross-sectional view through the substrate after the further processing step of forming first and second doped regions.

FIG. 14 shows a cross-sectional view through substrate 100 after the further processing step of forming first doped regions (junctions 140) and second doped regions (junctions 148). In one embodiment of the present invention, the first and second doped regions have work functions similar to the work functions of silicided gate electrodes 143 and 145, respectively. The N-type and P-type junction regions 140 and 148 are formed in P-well 105 and N-well 115, respectively in accordance with conventional techniques. N-type junction regions may be formed adjacent gate electrode 143 and aligned to the gate by implanting a suitable dopant, such as one of, arsenic, phosphorous, or antimony, into P-well 105. Similar processing steps may be used to form P-type junction regions 148, using a dopant, such as boron, for example. Gate isolation spacers 150 of a suitable dielectric may be formed around gate electrode 143 and gate electrode 145. Further dopants may then be added to the junction regions as desired. The NMOS and PMOS devices may then be coupled in a conventional manner, if desired, to form a NMOS and PMOS pair built according to CMOS technology.

The above process describes a method of forming a pair of NMOS and PMOS devices with complementary silicide metal gate electrodes. The invention provides this by producing gate electrodes entirely made of silicide metals that have work functions substantially similar with the work functions of the doped junctions of the PMOS and NMOS transistors made by way of the process according to one embodiment of the present invention. It should be appreciated by persons having ordinary skills in the art that the present invention equally applies to making individual MOSFET transistors with gate electrodes entirely made of silicide. The invention is particularly useful for constructing high performance NMOS and PMOS devices for use in connection with CMOS technologies.

Figure 15:
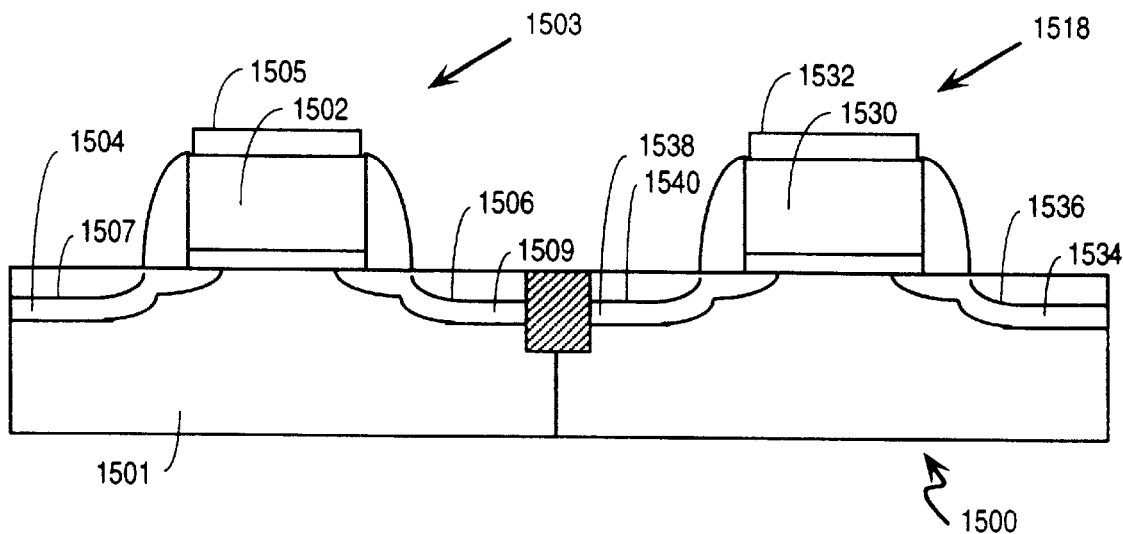
FIG. 15 illustrates NMOS and PMOS transistors fabricated on a substrate by way of conventional processing techniques.

The present invention further provides an alternative process for fabricating pairs of NMOS and PMOS devices or individual MOSFET devices with silicide gates. According to this alternative embodiment a NMOS transistor 1503 and a PMOS transistor 1518 shown in FIG. 15 are fabricated on a substrate 1501 by way of conventional processing techniques. Transistor 1503 includes gate 1502, made of polysilicon, drain 1509 and source 1504. Gate 1502 is silicided by a layer of silicide 1505 drain 1509 is silicided by a layer of silicide 1506, and source 1504 is silicided by a layer of silicide 1507. PMOS transistor 1518 includes similar elements as transistor 1503, only that the elements of transistor 1518 correspond to PMOS transistor elements. For purposes of simplicity, the discussion referring to NMOS transistor 1503 equally applies to PMOS transistor 1518.

Figure 16:
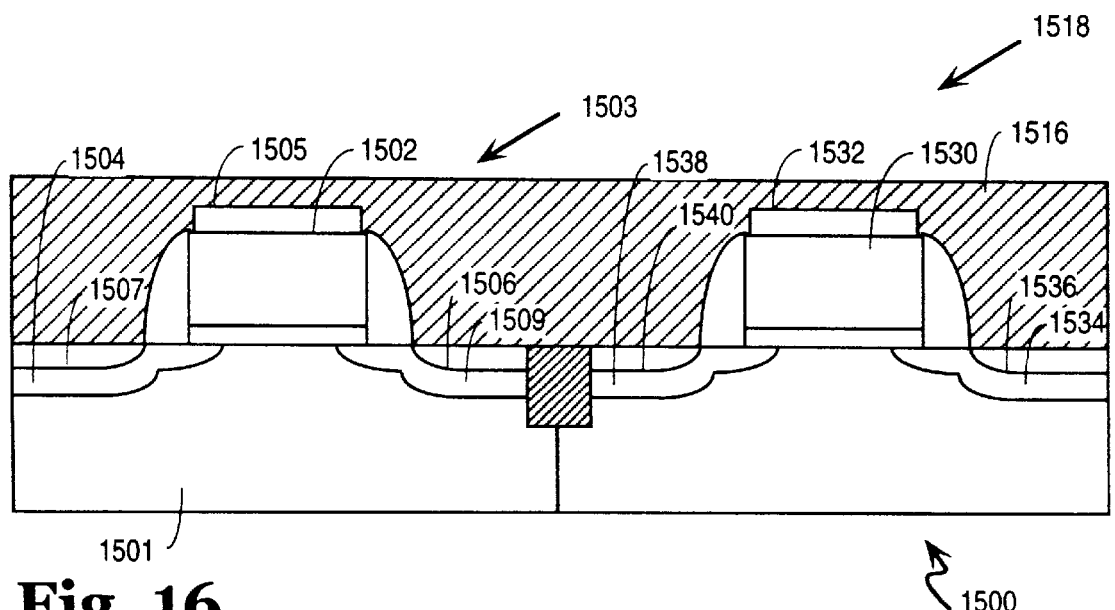
FIG. 16 shows the substrate with the NMOS and PMOS transistors of FIG. 15 with an interlayer dielectric deposited thereon.

The substrate 1501 is then subjected to a deposition of an interlayer dielectric (ILD) 1516 such as $SiO_2$ or a low dielectric constant (low-k) polymer as illustrated in FIG. 16.

Figure 17:
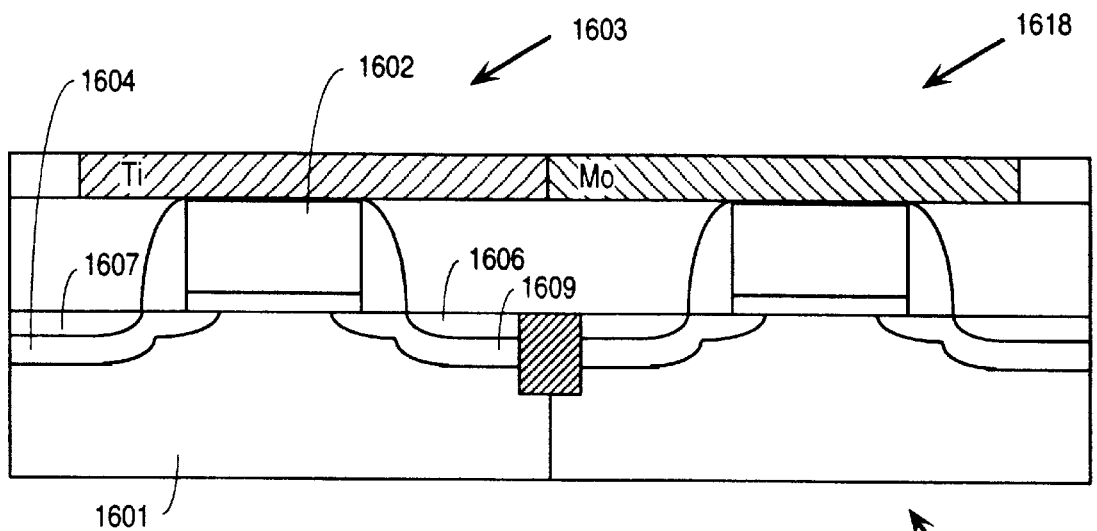
FIG. 17 illustrates a cross-sectional view through the substrate after the interlayer dielectric film is subjected to a chemical mechanical polishing process and metals are deposited on the gates of the NMOS and PMOS transistors.

FIG. 17 illustrates a cross-sectional view of the substrate 1501 after ILD 1516 is subjected to a Chemical Mechanical Polishing (CMP) process back to the gate level and stopped at the polysilicon gate. The previously formed silicide layers 1505 and 1532 are removed from the top of the polysilicon gates 1502 and 1530. This leaves the polysilicon gates exposed. Next, two different complementary metals such as Titanium and Molybdenum, for example, are deposited on top of gates 1502 and 1530 of the NMOS and PMOS transistors, and on top of the ILD adjacent NMOS transistor 1503 and PMOS transistor 1518 respectively, as shown in FIG. 17.

Figure 18:
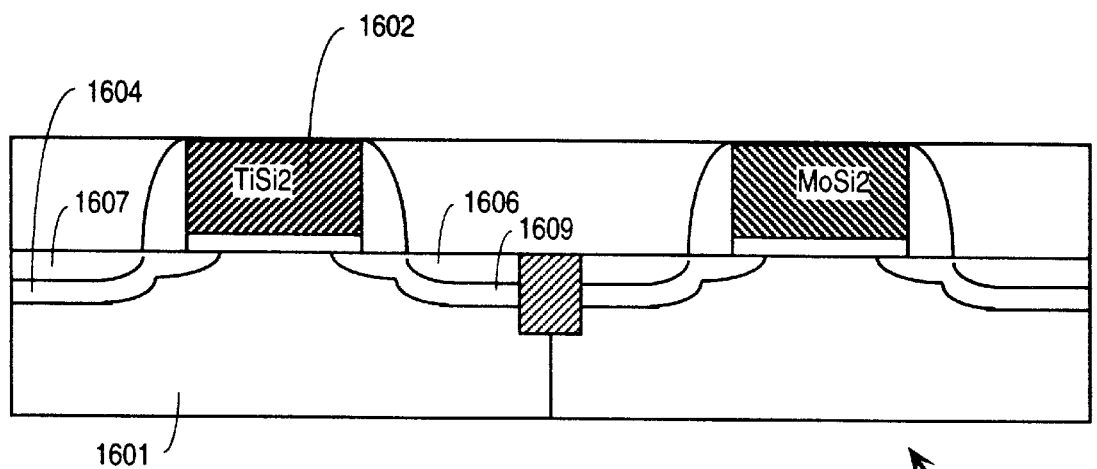
FIG. 18 illustrates a cross-sectional view through the substrate after the metals are caused to react with the underlying polysilicon gates of the NMOS and PMOS transistors.

Next the metals Mo and Ti are caused to react with the underlying polysilicon (ILD) gates of the NMOS and PMOS transistors to form suicides TiSi2 and MoSi2 with work functions of approximately 4.1 eV and 5.1 eV as shown in FIG. 18. The reaction may be caused by annealing to a temperature of approximately 750° Fahrenheit. The unreacted metal layers of Ti and Mo, if any such metal remains, are removed by etching with sulfuric acid, for example. Complementary metal gates with work functions of 4.1 and 5.1 electron volt are formed.

Figure 19:
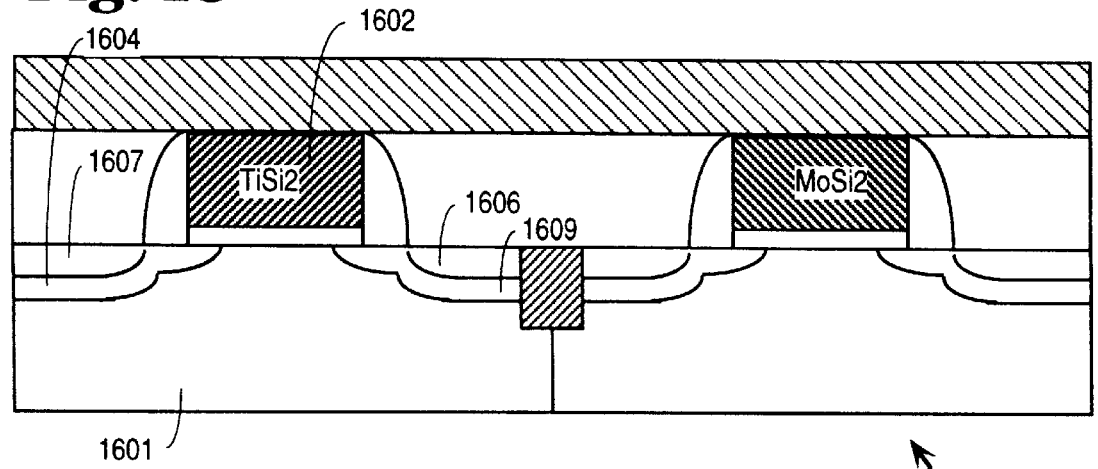
FIG. 19 illustrates the substrate of FIG. 18 with an interlayer dielectric deposited on top of the gates of the NMOS and PMOS transistors.

Another interlayer dielectric layer 1630 is deposited on top of the TiSi2 and MoSi2 silicide gates to isolate the gate electrodes 1502 and 1530 from metal interconnects as illustrated in FIG. 19.

In the preceding detailed description, the invention is described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A method of forming a first and second transistor devices, the method comprising:
   a. forming first region of silicide over a first portion of a gate dielectric that overlies a first well region in a semiconductor substrate;
   b. forming a second region of silicide, over a second portion of said gate dielectric that overlies a second well region in said semiconductor substrate; and
   c. forming first and second doped regions, in said first and second well regions, respectively.

2. The method of claim 1 wherein a. includes forming a layer of polysilicon over said first gate dielectric.

3. The method of claim 2 wherein a. further includes forming a first metal region over said layer of polysilicon formed over said first portion of said gate dielectric.

4. The method of claim 3 wherein a. further includes causing said first metal region to react with said layer of polysilicon formed over said first portion of gate dielectric.

5. The method of claim 1 wherein b. includes forming a layer of polysilicon over said second portion of said gate dielectric.

6. The method of claim 5 wherein b. further includes forming a second metal region over a portion of said layer of polysilicon formed over said second portion of gate dielectric.

7. The method of claim 6 wherein b. further includes causing said second metal region to react with said polysilicon layer formed over said second portion of gate dielectric.

8. The method of claim 3 wherein a first metal of said first metal region is selected so that a Fermi level of said first region of silicide is close to a Fermi level of said first doped regions.

9. The method of claim 6 wherein a second metal of said second metal region is selected so that a Fermi level of said second region of silicide is close to a Fermi level of said second doped regions.

10. The method of claim 3 wherein first metal region has a first thickness so that a reaction between said first metal with polysilicon underlying said first metal region consumes said polysilicon to form said first region of silicide.

11. The method of claim 6 wherein said second metal region has a second thickness so that a reaction between said second metal with said polysilicon underlying said second metal region consumes said polysilicon to form said second region of silicide.

12. The method of claim 1 wherein said first and second silicided regions are formed by way of a process of annealing.

13. The method of claim 12 wherein the process of annealing takes place at a temperature of approximately 750° Celsius.

14. The method of claim 3 wherein said first metal region is formed by
   depositing a first metal layer on said polysilicon layer;
   patterning said first metal layer; and
   etching said first metal layer into said first metal region.

15. The method of claim 6 wherein said second metal region is formed by
   depositing a second metal on said polysilicon layer;
   patterning said second metal layer; and
   etching said second metal layer into said second metal region.

16. The method of claim 1 further including etching said first and second regions of silicide to form first and second gate electrodes.

17. The method of claim 16 wherein said first doped junction regions are formed adjacent said first gate electrode and said second doped regions are formed adjacent said second gate electrode.

18. A method of forming a complementary semiconductor device, the method comprising:
   forming an isolation between a first and a second metal oxide semiconductor field effect transistors (MOSFET);
   forming a first metal layer on top of a gate of said first MOSFET;
   forming a second metal layer on top of a gate of said second MOSFET;
   forming a first region of silicide by causing said first metal layer to react with underlying polysilicon material included in said gate of said first MOSFET; and
   forming a second region of silicide by causing said second metal layer to react with underlying polysilicon material included in said gate of said second MOSFET.

19. The method of claim 18 wherein said isolation is formed by depositing a low dielectric constant material between said gates of said first and second MOSFET.

20. The method of claim 19 further including, before forming the first and second metal layers, planarizing said isolation material to a level of a top surface of said gates of said first and second MOSFETS.

* * * * *

UNITED STATES PATENT AND TRADEMARK OFFICE
CERTIFICATE OF CORRECTION

PATENT NO.    : 6,204,103 B1
DATED         : March 20, 2001
INVENTOR(S)   : Gang Bai et al.

Page 1 of 1

It is certified that error appears in the above-identified patent and that said Letters Patent is hereby corrected as shown below:

Column 2,
Line 56, delete "FIG. 7 illustrates the substrate of FIG. 7" and insert -- FIG. 7 illustrates the substrate of FIG. 6 --.

Signed and Sealed this

Twenty-first Day of May, 2002

Attest:

JAMES E. ROGAN
Director of the United States Patent and Trademark Office

Attesting Officer